United States Patent

Torkkola

[11] Patent Number: 5,999,567
[45] Date of Patent: Dec. 7, 1999

[54] METHOD FOR RECOVERING A SOURCE SIGNAL FROM A COMPOSITE SIGNAL AND APPARATUS THEREFOR

[75] Inventor: Kari Torkkola, Chandler, Ariz.

[73] Assignee: Motorola, Inc., Schaumburg, Ill.

[21] Appl. No.: 08/741,507

[22] Filed: Oct. 31, 1996

[51] Int. Cl.[6] .............. H03H 7/30; H03H 7/40; H03K 5/159
[52] U.S. Cl. .............. 375/232; 375/350; 708/323
[58] Field of Search .................. 370/290, 292; 375/229, 231, 232, 346, 348, 350, 285, 254; 364/724.011, 724.014, 724.17, 825, 724.2; 708/300, 304, 320, 323, 819

[56] References Cited

U.S. PATENT DOCUMENTS

| | | | |
|---|---|---|---|
| 5,117,401 | 5/1992 | Feintuch | 367/135 |
| 5,311,546 | 5/1994 | Paik et al. | 375/232 |
| 5,388,080 | 2/1995 | Feintuch et al. | 367/135 |
| 5,416,799 | 5/1995 | Currivan et al. | 375/232 |
| 5,434,883 | 7/1995 | Kimoto et al. | 375/231 |
| 5,598,434 | 1/1997 | Kaku et al. | 375/229 |
| 5,608,804 | 3/1997 | Hirano | 381/71 |
| 5,638,311 | 6/1997 | Fujii et al. | 364/724.19 |
| 5,638,439 | 6/1997 | Kawada et al. | 379/411 |
| 5,664,011 | 9/1997 | Crochiere et al. | 379/410 |
| 5,668,747 | 9/1997 | Ohashi | 364/724.19 |
| 5,694,476 | 12/1997 | Klippel | 381/96 |
| 5,768,313 | 6/1998 | Kuribayashi | 375/232 |

OTHER PUBLICATIONS

A.J. Bell and T.J. Sejnowski, An Information–maximisation approach to blind separation and blind deconvolution, Neural Computation, 7(6):1130–1159, 1995.
C. Jutten and J. Herault, Blind Separation of Sources, part I: An Adaptive Algorithm Based on Neuromimetic Architecture, Signal Processing, 24(1):1–10, 1991.

*Primary Examiner*—Chi H. Pham
*Assistant Examiner*—Jean B Corrielus
*Attorney, Agent, or Firm*—Sharon K. Coleman; Eugene A. Parsons; William E. Koch

[57] ABSTRACT

Methods and apparatus for recovering a desired signal from a composite signal. In one method, sample-based information maximization techniques for blind deconvolution are utilized to learn a filter (22) which removes undesired dependencies from the composite signal. Entropy as an expectation over individual samples of the composite signal is maximized. In another method, dependencies of the composite signal are selectively removed by learning a first filter (42) that removes the desired dependencies and outputs a filtered signal. The filtered signal is used as the learning material for a second filter (44) such that the second filter learns to remove only the remaining dependencies (undesired dependencies) from the filtered signal. The composite signal is applied to the second filter (44) which thereby removes the undesired dependencies.

3 Claims, 1 Drawing Sheet

METHOD FOR RECOVERING A SOURCE SIGNAL FROM A COMPOSITE SIGNAL AND APPARATUS THEREFOR

BACKGROUND OF THE INVENTION

The present invention relates, in general, to signal processing and, more particularly, to blind deconvolution.

Signals are commonly processed using filters to suppress or enhance desired components of the signal or to remove undesired components of the signal. Typically, the signal to be processed comprises more than simply the original or source signal and the desire is to process the signal to recover the original or source signal. Often, however, little is known about the source signal. For example, there may be no knowledge of the source signal or the particular filters, e.g., room acoustics, transmission channels, or the like, that the source signal was subjected to. The filters create time delayed versions of the signal, such as, echoes, intersymbol interference, or the like (referred to as dependencies) resulting in the signal being a composite signal.

Blind deconvolution refers to techniques utilized to remove dependencies from a composite signal to yield the source signal. The techniques are called blind because the source signal is attained without assuming any knowledge of the source signal or the dependencies. The signal may be a digital communications signal, an acoustical signal, an RF signal, or the like and the dependencies may include echoes, reverberations, intersymbol interference, or redundancies of the source signal, among other things.

More particularly, blind deconvolution refers to removing dependencies from an unknown signal s. Unknown signal s is convolved with an unknown filter having an impulse response, a (which creates the dependencies) The resulting corrupted or composite signal x is:

$$x = s * a, \quad \text{or} \qquad \text{(Equation 1)}$$
$$x_t = \sum_{k=0}^{L_a} a_k s_{t-k},$$

where $L_a$ is the length of filter a and the subscript t refers to time, for example, signal s comprises discrete samples $x_0$, $x_1$, ..., $x_{t-1}$, $x_t$ and t is the present time or most recent sample of signal x. (As used herein "*" denotes convolution.) When used with filter coefficients (as in Equation 1), the subscript refers to the delay from the current sample.

Blind deconvolution attempts to recover unknown signal s by learning a filter w which reverses the effect of unknown filter a so that $$u = x * w, \quad \text{or} \qquad \text{(Equation 2)}$$
$$u_t = \sum_{k=0}^{L} w_k x_{t-k}$$

would be equal to the original signal s. Blind deconvolution assumes that the samples of original signal $s_t$ are statistically independent. As is seen from Equation 1, filter a spreads information from one sample $s_t$ to all samples $x_t$, ..., $x_{t+L_a}$. Blind deconvolution attempts to remove these redundancies (also referred to as dependencies).

A. J. Bell and T. J. Sejnowski have shown that a suitable criterion for learning a finite impulse response (FIR) filter for blind deconvolution is to maximize the information at the output of the FIR filter, as discussed in "An information maximization approach to blind separation and blind deconvolution", Neural Computation, 7(6):1004–1034, 1995. Bell and Sejnowski proposed to learn a filter w that is a restoring causal (or adaptive) FIR filter by using an information theoretic measure. The output signal from the FIR filter is passed through a nonlinear squashing function which approximates the cumulative density function of output signal. By maximizing the information transferred through this system, Bell and Sejnowski were able to learn a FIR filter, w, that removes dependencies.

The Bell and Sejnowski approach chops the composite signal into blocks comprising a plurality of consecutive signal samples having a predetermined length, M. The filtering is formulated as a multiplication of a block by a lower triangular matrix having coefficients of filter w, followed by the nonlinear squashing function (denoted herein as function "g"). When the information at the transformed information output block is maximized, dependencies within the block are removed.

As demonstrated by Bell and Sejnowski, information maximization is equal to maximizing the entropy, H(Y), at the output, where entropy is the expectation, E, of the probability density function of the output. Maximizing the entropy is equivalent to maximizing E[ln|J|], where J is the Jacobian of the whole system. The Jacobian, J, tells how the input affects the output and, in the method developed by Bell and Sejnowski, is represented as a matrix of partial derivatives of each component of the output block with respect to each component of the input block. By computing the determinant of J and the gradient of ln|J| with respect to the coefficients of the matrix (or weights of the filter), Bell and Sejnowski derived a stochastic gradient ascent rule to update the filter coefficients over time (the adaptation rule).

While the method proposed by Bell and Sejnowski yields a good result, it has its limitations. Learning an adaptive filter by the method of Bell and Sejnowski requires complex computations. Further, the Bell and Sejnowski method and adaptation rule is limited to FIR filters. Filters such as infinite impulse response (IIR) or recursive filter cannot be learned from the Bell and Sejnowski adaptation rule because of complex recursive relationships between components of the output block and components of the input block. IIR filters, however, provide a desirable advantage over FIR filters. IIR filters can model complicated and long impulse responses with a small number of coefficients in comparison to FIR filters and do so with less computational complexity than FIR filters.

Accordingly, there is a need for a method of retrieving a source signal from a composite signal without assuming knowledge of the source signal or its dependencies that produces a good quality result without overly complex computations and which is applicable to a variety of adaptive filters.

Blind deconvolution is clearly an ideal tool to remove signal dependencies, such as echoes, of unknown delays and amplitudes. Because echoes are copies of the original or source signal delayed and summed to the original signal, they are redundancies that blind deconvolution tends to remove. While also advantageous in that blind deconvolution retrieves a source signal without knowledge of the signal, current blind deconvolution techniques have limitations when processing certain types of signals, such as, for example, speech signals.

A key assumption made with blind deconvolution is that the original or source signal, s, is white; meaning that consecutive signal samples, $s_i$ and $s_j$, are statistically independent for all times i and j, where i≠j. While this assumption may be true for signals in digital communications, it is not true for many acoustic signals. For example, speech signals exhibit very strong inherent dependencies when i−j≤4 milliseconds, i.e., two consecutive samples of speech ($s_i$ and $s_j$) are dependent on each other, and this dependency has a scope of approximately four (4) milliseconds. Speech signals are comprised of vocal cord vibrations filtered by the vocal tract, thereby producing short term or inherent dependencies within the speech signal. In addition to these short term dependencies, longer term or noninherent dependencies (e.g. greater than approximately 4 milliseconds for speech signals) are often present in the signal, such as echoes due to room acoustics, transmission reflections, or the like.

Blind deconvolution learns to remove time dependencies present within a signal that fall with in the length of the deconvolution filter w. Thus, while learning to remove dependencies, such as those due to echoes, blind deconvolution also learns to remove the dependencies that are inherent to the speech itself. When processing a speech signal to remove echoes and recover the source signal, commonly referred to as echo cancellation, it is not desirable to remove or filter out the inherent dependencies of the speech that are present in the source signal. The result of doing so is a filtered or whitened speech signal, which sounds like a high-pass filtered version of the original speech.

With current blind deconvolution methods of signal processing, only when there is exact knowledge about the delays of the echoes, can this whitening effect be avoided. In theory, by forcing some filter coefficients to zero, or having taps only at multiples of the delay, the filter would learn the amplitude of the echo to cancel. In practical situations, however, this is not possible because, generally, there are multiple echoes.

Other known techniques for echo cancellation, including, for example, adaptive filters trained by Least Mean Squares (LMS) and Cepstral processing, are also inadequate.

Adaptive filters trained by LMS techniques are beneficial in that they can adapt to changing conditions, such as to moving or varying sources, and they produce a good quality result with relatively low computational complexity. However, training adaptive filters by LMS has limitations. LMS trained adaptive filter techniques require knowledge of the source signal but, often the only known signal is the composite signal. Thus, if the source signal is unknown, LMS trained adaptive filter techniques are of no use.

Cepstral processing techniques permit processing of a composite signal without knowledge of the source signal. With Cepstral processing, the composite signal is processed through a series of Fourier transforms, inverse Fourier transforms, logarithmic and anti-logarithmic operations to reproduce the source signal. Although beneficial in that knowledge of the source signal is not required, Cepstral processing techniques employ complex computations and produce results of only moderate quality. Moreover, although knowledge of the source signal is not required, Cepstral processing requires knowledge of the delays of the echoes, and Cepstral processing techniques are not adaptable to changing conditions.

Accordingly, there is a need for a method of processing signals without knowledge of the original or source signal or its dependencies that retains "desirable" dependencies, such as dependencies inherent to the signal itself, while removing "undesirable" dependencies, such as non-inherent dependencies.

BRIEF DESCRIPTION OF THE DRAWINGS

The present invention will be hereinafter described with reference to the drawing figures, wherein like numerals denote like elements or steps and wherein.

DETAILED DESCRIPTION OF THE DRAWINGS

Generally, the present invention provides a blind deconvolution method and apparatus for recovering a source signal from a composite signal. For example, signals used in digital communications can be processed using blind deconvolution to remove dependencies such as intersymbol interference within the signal caused, for example, by the transmission channel. Similarly, an acoustic signal can be processed using blind deconvolution to remove dependencies such as echoes and reverberations, within the signal caused, for example, by the room acoustics. In accordance with one aspect of the present invention, a signal is processed using a blind deconvolution method based on an adaptive filter learned from a sample-based adaptation rule.

In accordance with another aspect of the present invention, a signal is processed using blind deconvolution to remove undesirable dependencies present within the signal while retaining desirable or inherent dependencies of the signal. According to this aspect of the invention, a signal is whitened using a first filter that removes the inherent or desired dependencies. The whitened signal is then used as the training material to learn a second filter. This second filter learns to remove only the undesired dependencies (because the undesired dependencies are the only dependencies still present in the signal). The learned second filter is then applied to the original signal, wherein the undesired dependencies are removed while the desired dependencies are retained.

Figure 1:
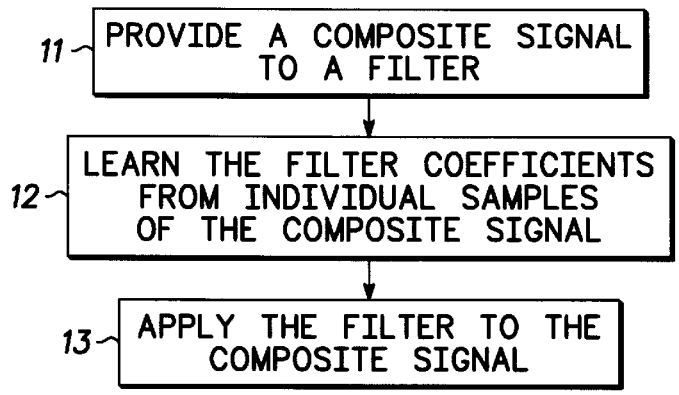
FIG. 1 is a flow diagram of a method for blind deconvolution in accordance with the present invention.

Referring to FIG. 1, a flow diagram 10 of a blind deconvolution method for recovering a source signal from a composite signal is shown. In a first step (reference no. 11), a composite signal is provided to a deconvolution or adaptive filter. In a second step (reference no. 12), the adaptive filter learns its coefficients from individual samples of the composite signal. In a third step (reference no. 13), the learned adaptive filter is applied to the composite signal. In accordance with one aspect of the invention, in the second step (reference no. 12), the adaptive filter iteratively or continuously learns its coefficients from individual samples of the composite signal.

Figure 2:
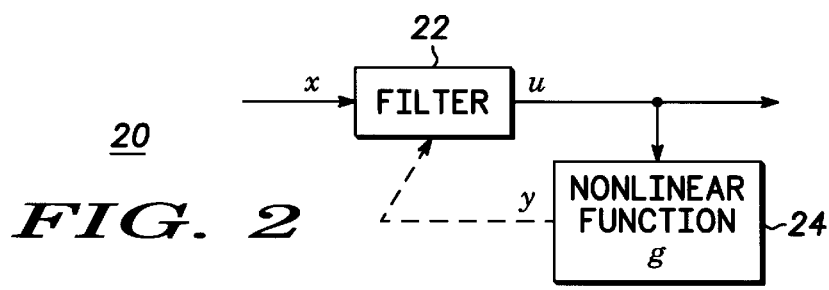
FIG. 2 is a block diagram of an apparatus for blind deconvolution of a signal in accordance with the present invention.

Referring now to FIG. 1 and FIG. 2, which shows a signal processor 20 for processing a composite signal, in the first step (reference no. 11), a composite signal x is received by an adaptive filter 22. Composite signal x is a sampled signal comprising a plurality of individual signal samples $x_0$, $x_1, \ldots, x_t$. Composite signal x further comprises a source signal and at least one dependency of that source signal. In the second step (reference no. 12), adaptive filter 22 iteratively learns its coefficients (represented by a dashed line in FIG. 2), individual sample by individual sample of composite signal x. In the third step (reference no. 13), learned adaptive filter 22 is applied to composite signal x. Learned adaptive filter 22 filters the dependencies of composite signal x and outputs an output or deconvolved signal u comprising the source signal.

With more particular reference to the second step (reference no. 12), adaptive filter 22 learns its coefficients through sample-based information maximization techniques. In accordance with the present invention, individual samples of composite signal x are passed through adaptive filter 22. The output of adaptive filter 22, deconvolved signal u, is then subjected to a nonlinear function, g (reference no. 24) which transforms deconvolved signal u. The resultant signal, transformed signal y, is provided to adaptive filter 22 wherein adaptive filter 22 learns coefficients that remove dependencies of composite signal x. In accordance with the present invention, the information content of deconvolved signal u which passes through nonlinear function q is maximized, which is equivalent to maximizing the entropy of deconvolved signal u which passes through nonlinear function g.

Nonlinear function g approximates the cumulative density function of deconvolved signal u. Thus, the derivative of g(u) approximates the probability density function of u. Adaptive filter 22 is learned by passing deconvolved signal u through nonlinear function g, and by determining filter coefficients w which produce the true density of deconvolved signal u, which in turn produces uniform density at the output of nonlinear function g. This is equal to maximizing the entropy of deconvolved signal u (or maximizing the information content of deconvolved signal u).

Any nonlinear function which approximates the cumulative density function may be used. For example, the hyperbolic tangent (tanh) function is a good approximation for positively kurtotic signals, such as speech signals. In accordance with an aspect of the present invention, nonlinear function g (reference no. 24) is defined by $y_t = g(u_t)$, where $g(u) = \tanh(u)$ and t denotes time, i.e., $u_t$ is the current or most recent sample of deconvolved signal u and $y_t$ is the current or most recent sample of the output of nonlinear function g, transformed signal y.

Contrary to the information maximization techniques employed by Bell and Sejnowski, the present invention maximizes entropy as an expectation over individual samples thereby simplifying the learning of the adaptive filter (or deconvolution filter). Further, by utilizing individual samples of a signal to derive the adaptation filter rule, filters that could not be learned from an adaptation rule derived from blocks of the signal can be learned, such as, for example, IIR filters, non-linear filters, or the like.

More particularly, whereas the Jacobian, J, of a block signal samples, M, would result in a matrix, the Jacobian of a single signal sample is a scalar. For example, the output from an FIR filter of a single sample at a given time is:

$$u_t = \sum_{k=0}^{L} w_k x_{t-k} \qquad \text{(Equation 3)}$$

$$y_t = g(u_t), \qquad \text{(Equation 4)}$$

where $y_t$ is $u_t$ after being subjected to the nonlinear function g. Because the entropy of transformed signal y is already an expectation, $H(y) = -E[\ln(f_y(y))]$, it contains information about the whole transformed signal y. Nothing is gained by maximizing an expectation over blocks of transformed signal y compared to maximizing an expectation over single samples of transformed signal y. Maximizing an expectation of a single sample yields a simpler case wherein the Jacobian is a scalar:

$$J = y_t' = \frac{\partial y_t}{\partial x_t} = \frac{\partial y_t}{\partial u_t}\frac{\partial y_t}{\partial x_t} = \hat{y}_t w_0 = (1 - y_t^2)w_0. \qquad \text{(Equation 5)}$$

The stochastic gradient ascent rule can be derived by taking the gradient of ln(J) with respect to the weights. First, computing:

$$\frac{\partial y_t'}{\partial w_0} = \hat{y} + w_0 \frac{\partial \hat{y}_t}{\partial w_0}$$

$$= \hat{y}_t + w_0(-2y_t)\frac{\partial y_t}{\partial w_0}$$

$$= \hat{y}_t - 2w_0 y_t \frac{\partial y_t}{\partial u_t}\frac{\partial u_t}{\partial w_0}$$

$$= \hat{y}_t - 2w_0 y_t \hat{y}_t x_t.$$

The adaptation rule for $w_o$ is now readily obtained:

$$\Delta w_0 \propto \frac{\partial \ln(y_t')}{\partial w_0} = \frac{1}{y_t'}\frac{\partial y_t'}{\partial w_0} = \frac{1}{w_0} - 2y_t x_t. \qquad \text{(Equation 6)}$$

Because $$\frac{\partial y_t'}{\partial w_j} = -2w_0 y_t \hat{y}_t x_{t-j},$$

a rule for the other weights can be derived as follows:

$$\Delta w_j \propto \frac{1}{y_t'}\frac{\partial y_t'}{\partial w_j} = -2y_t x_{t-j} \qquad \text{(Equation 7)}$$

where denotes proportionality.

Preferably, the weight or coefficient changes for a number of signal samples are accumulated before making a change to the weight or coefficient. The preferred number of signal samples will vary based on application and can be determined through experimentation.

Thus, the adaptation rules of the present invention are true stochastic gradient ascent rules for each sample individually. On the other hand, the Bell and Sejnowski adaptation rules accumulate the weight changes in a block of M samples before doing an adjustment. Moreover, the Bell and Sejnowski adaptation rule has an adverse border effect because fewer samples of data (M–L samples) contribute to weights at the end of filter w compared to weights at the beginning of the filter (M samples), if M (the block length) is not much larger than L (the filter length). Looking at the signal one sample at a time, in accordance with the present invention results in a more accurate adaptation rule.

In accordance with an alternative embodiment, the sample-based information maximization techniques of the present invention may be utilized to learn filters other than a FIR filter. For example, a recursive filter can be learned by deriving an adaptation rule from individual samples of a signal.

The output of a single sample from a recursive filter before the nonlinearity at a given time is:

$$u_t = w_0 x_t + \sum_{k=1}^{L} w_k u_{t-k}.$$ (Equation 8)

The quantity to maximize remains the same, E[ln(J)]. The Jacobian of the filter is now exactly the same as in Equation 5. Also $\partial y_t'|\partial w_0$ and the adaptation rule for $w_o$ turn out to be the same as for the FIR filter of the present invention as discussed hereinabove.

To derive the recursive filter adaptation equation for other weights or coefficients, $w_j$, $\partial y_t'|\partial w_j$ is first computed as follows:

$$\frac{\partial y_t'}{\partial w_j} = \frac{\partial (1 - y_t^2) w_0}{\partial w_j}$$

$$= w_0(-2y_t) \frac{\partial y_t}{\partial u_t} \frac{\partial u_t}{\partial w_j}$$

$$= w_0(-2y_t) \hat{y}_t \frac{\partial u_t}{\partial w_j}.$$

A difficulty is caused by $\partial u_t|\partial w_j$ which is a recursive quantity. Taking the derivative of Equation 8 with respect to $w_j$ gives:

$$\frac{\partial u_t}{\partial w_j} = u_{t-j} + w_j \frac{\partial u_{t-j}}{\partial w_j}$$

$$= u_{t-j} + w_j \left( u_{t-2j} + w_j \frac{\partial u_{t-2j}}{\partial w_j} \right)$$

$$= \sum_{k=1}^{t/j} (w_j)^{k-1} u_{t-k \cdot j}.$$

First, the following recursive quantity is defined in a fashion similar to using an LMS algorithm with adaptive recursive filters:

$$\alpha_j^t \equiv \frac{\partial u_t}{\partial w_j} = u_{t-j} + w_j \alpha_j^{t-j}.$$

The rule for $w_j$ is then obtained:

$$\Delta w_j \propto \frac{1}{y_t'} \frac{\partial y_t'}{\partial w_j} = -2 y_t \alpha_j^t.$$ (Equation 9)

This recursive filter adaptation rule (Equation 9) necessitates keeping track of $\alpha_j^t$ for each filter coefficient, $w_j$. Alternatively, an approximation of this adaptation rule (Equation 9) can be used. The approximation of this rule (Equation 9) leads to the same convergence condition. Convergence of the adaptation rule (Equation 9) is achieved when the weight change becomes zero, that is when:

$$E[\Delta w_j] = E[-2 y_t \alpha_j^t] =$$

$$0 \Leftrightarrow E \left[ y_t \sum_{k=1}^{t/j} (w_j)^{k-1} u_{t-k \cdot j} \right] = 0 \Leftrightarrow \sum_{k=1}^{t/j} (w_j)^{k-1} E[y_t u_{t-k \cdot j}] = 0$$

holds for all j. This is true if $E[y_t u_{t-j}]=0$ for all j, which is the convergence condition the adaptation rule obtained from Equation 9 by replacing $\alpha_j^t$ by $u_{t-j}$ yielding $$\Delta w_j - 2 y_y u_{t-j},$$ (Equation 10)

the preferred adaptation rule for the coefficients of the adaptive recursive filter.

For an effective implementation of an adaptive IIR filter in accordance with the present invention, the training data (signal samples) is used sequentially, because the previous values of $u_{t-j}$ are stored in a buffer. In contrast to the IIR filter, the FIR filter can be trained by picking the training points randomly in the signal.

It should be understood that the FIR and IIR embodiments discussed herein are not limitations of the present invention. Other filters, including nonlinear filters, can be learned in accordance with the present invention by deriving an adaptation rule from single or individual samples of a signal or learning material. Furthermore, the form of filter learned is not a limitation of the present invention. For example, a direct, cascade, parallel, or lattice form of an IIR or FIR filter may be learned.

Figure 3:
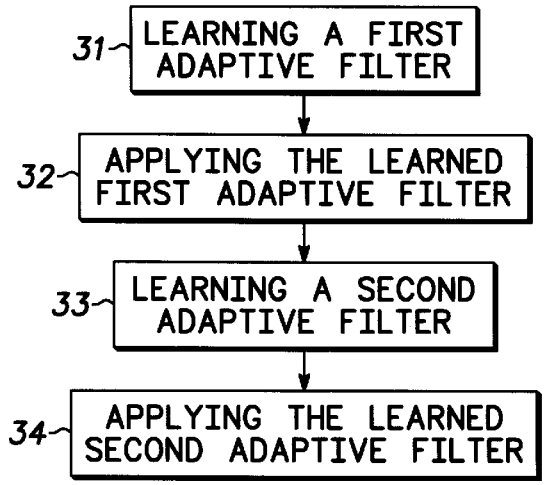
FIG. 3 is a flowchart of a method for selectively removing dependencies from a signal in accordance with the present invention.

Referring now to FIG. 3, a flowchart 30 of a method for selectively removing dependencies such as, for example, noninherent dependencies, from a composite signal is shown. In a first step (reference number 31), a first adaptive filter is learned from the composite signal. In a second step (reference number 32), the learned first adaptive filter is applied to the composite signal wherein a first portion of the composite signal's dependencies are removed. In a third step (reference number 33), a second adaptive filter is learned from the output of the learned first adaptive filter. In a fourth step (reference number 34), the learned second adaptive filter is applied to the composite signal wherein a second portion of the composite signal's dependencies are removed.

Figure 4:
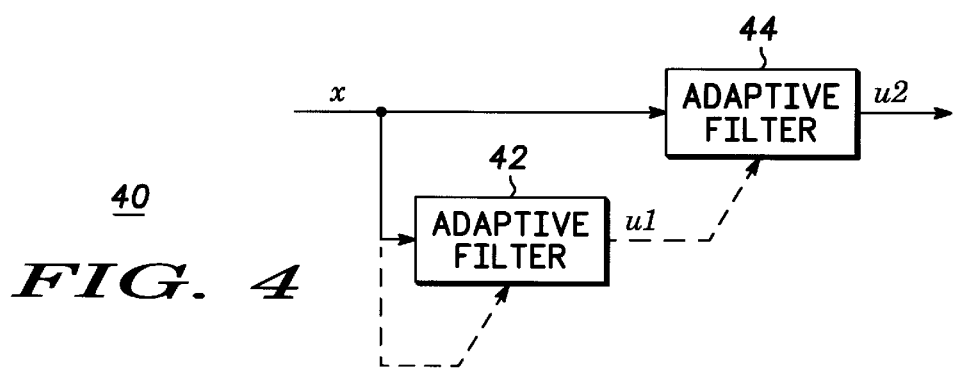
FIG. 4 is a block diagram of an apparatus for selectively removing dependencies from a signal in accordance with the present invention.

Referring now to FIGS. 3 and 4, wherein FIG. 4 shows a signal processor 40, in the first step (reference no. 31), composite signal x, such as a speech signal, is received by a first adaptive filter 42. Adaptive filter 42 iteratively learns its coefficients from composite signal x (represented by dashed signal x in FIG. 4). In accordance with the present invention, learned first adaptive filter 42 comprises a blind deconvolution filter whose length is designed to only encompass the desired dependencies of composite signal x. By way of example, the inherent dependencies in speech have a scope of approximately four (4) milliseconds. An FIR filter of 32 taps (corresponding to an 8 kilohertz sampling frequency) may be learned to produce or output a signal which contains all dependencies having longer delays than the farthest tap of the FIR filter; these dependencies being the unknown or undesired dependencies (e.g., echoes in a speech signal).

In the second step (reference no. 32), learned first adaptive filter 42 receives composite signal x and filters or removes the desired dependencies from composite signal x (e.g. the short-term or inherent dependencies of speech). Learned first adaptive filter 42 outputs a first filtered or whitened signal u1 which contains undesired dependencies.

In the third step (reference no. 33), whitened signal u1 is provided to a second adaptive filter 44. Second adaptive filter 44 iteratively learns its coefficients from whitened signal u1 (represented as a dashed signal u1 in FIG. 4), i.e., the output of first adaptive filter 42. Second adaptive filter 44 comprises a blind deconvolution filter whose length is sufficiently long to encompass the (undesired) dependencies remaining in whitened signal u1 (and whose length is greater than that of first adaptive filter 42). Accordingly, second adaptive filter 44 learns to remove only those dependencies not filtered by learned first adaptive filter 42, i.e., those dependencies beyond the range or outside the length of first adaptive filter 42, namely the noninherent or undesired dependencies.

In the fourth step (reference no. 34), second adaptive filter 44 receives composite signal x and filters or removes the undesired or noninherent dependencies from composite signal x, leaving the desired or inherent dependencies intact. Second adaptive filter 44 outputs a second filtered or source signal u2 comprising, for example, the primary speech component and the dependencies inherent to the speech; thus, second adaptive filter 44 outputs source signal u2 that is not distorted by the whitening effect of blind deconvolution.

It should be understood that the types of blind deconvolution adaptive filters used in selectively removing dependencies from a signal is not a limitation of the present invention. For example, the adaptive filter can be a FIR filter, learned from the techniques of the present invention as described hereinabove or from previously known techniques; an IIR filter; a lattice filter; or the like. In addition, the learning of the filters is not limited to information maximization methods. Other methods of applying blind deconvolution such as Bussgang, Sato, Gray, or the like may be used.

The method of selectively removing undesired or noninherent dependencies in accordance with the present invention is suitable for a variety of applications, including echo cancellation, restoration of audio data (e.g., recordings in an echoing hall), and generally for improving the voice quality in any application where the voice is recorded in echoing or reverberant surroundings (e.g., speakerphone in a room, hands-free cellular phone in a car).

By now it should be appreciated that the blind deconvolution methods of the present invention provide enhanced applications to adaptive filters. By providing sample-based information maximization, the method of the present invention simplifies the learning computations for adaptive filters and results in a more accurate filter adaptation rule than the methods of the prior art. Further, by providing sample-based information maximization, the method of the present invention provides for the learning of various types of filters. Further, by providing a method for selective removal of signal dependencies, the present invention enhances the applicability of blind deconvolution to signals having components that a user does not want filtered out, such as the inherent dependencies in speech.

While the invention has been described with reference to speech signals, it should be understood that the invention is not limited to the processing of speech signals. The references and embodiments described herein are for example purposes to aid in the teaching of the invention. Additional uses, forms, and improvements of the invention will become evident to those skilled in the art. It should be understood, that the present invention is not limited to the embodiments described herein. It is intended that the appended claims cover all uses, forms, and modifications that do not depart from the spirit and scope of this invention.

I claim:

1. A method of recovering a source signal from a composite signal comprising a plurality of individual signal samples, the composite signal including the source signal and at least one dependency of the source signal, the method comprising the steps of:

providing the composite signal to a finite impulse response filter;

learning coefficients of the finite impulse response filter from individual signal samples in accordance with the following equations $$\Delta w_0 \propto \frac{\partial \ln(y'_t)}{\partial w_0} = \frac{1}{y'_t} \frac{\partial y'_t}{\partial w_0} = \frac{1}{w_0} - 2y_t x_t$$

$$\Delta w_j \propto \frac{1}{y'_t} \frac{\partial y'_t}{\partial w_j} = 2y_t x_{t-j}$$

where:

$x_t$ is a current composite signal sample;

$y_t$ is a current transformed output signal in accordance with the following equation:

$y_t = g(u_t)$ g is the nonlinear function defined by $g(u) = \tanh(u)$;

$u_t$ is a current finite impulse response filter output signal sample;

$w_0$ is a filter coefficient with zero delay with respect to the current composite signal sample $x_t$; and $w_j$ is a filter coefficient with delay j with respect to the current composite signal sample $x_t$; and applying the composite signal to the finite impulse response filter for removing said at least one dependency of the source signal.

2. A method of recovering a source signal from a composite signal comprising a plurality of individual signal samples, the composite signal including the source signal and at least one dependency of the source signal, the method comprising the steps of:

providing the composite signal to an infinite impulse response filter;

learning coefficients of the infinite impulse response filter from individual signal samples in accordance with the following equations $$\Delta w_0 \propto \frac{\partial \ln(y'_t)}{\partial w_0} = \frac{1}{y'_t} \frac{\partial y'_t}{\partial w_0} = \frac{1}{w_0} - 2y_t x_t$$

$$\Delta w_j \propto -2y_t u_{t-j}$$

where:

$x_t$ is a current composite signal sample;

$y_t$ is a current transformed output signal in accordance with the following equation:

$y_t = g(u_t)$ g is the nonlinear function defined by $g(u) = \tanh(u)$;

$u_t$ is a current infinite impulse response filter output signal sample;

$w_0$ is a filter coefficient with zero delay with respect to the current composite signal sample $x_t$; and $w_j$ is a filter coefficient with delay j with respect to the current composite signal sample $x_t$; and applying the composite signal to the infinite impulse response filter for removing said at least one dependency of the source signal.

3. A method of recovering a source signal from a composite signal comprising a plurality of individual signal samples, the composite signal including the source signal and at least one dependency of the source signal, the method comprising the steps of:

providing the composite signal to an infinite impulse response filter;

learning coefficients of the infinite impulse response filter from individual signal samples in accordance with the following equations $$\alpha_j^t \equiv \frac{\partial u_t}{\partial w_j} = u_{t-j} + w_j \alpha_j^{t-j}$$

$$\Delta w_0 \propto \frac{\partial \ln(y_t')}{\partial w_0} = \frac{1}{y_t'} \frac{\partial y_t'}{\partial w_0} = \frac{1}{w_0} - 2 y_t x_t$$

$$\Delta w_j \propto \frac{1}{y_t'} \frac{\partial y_t'}{\partial w_j} = -2 y_t \alpha_j^t$$

where:
$x_t$ is a current composite signal sample;
$w_0$ is a filter coefficient with zero delay with respect to the current composite signal sample $x_t$;
$w_j$ is a filter coefficient with delay j with respect to the current composite signal sample $x_t$;
$\alpha_j^t$ is a recursive output;
$y_t$ is a current transformed output signal in accordance with the following equation:

$$y_t = g(u_t);$$

and g is the nonlinear function defined by $g(u) = \tanh(u)$; and
applying the composite signal to the infinite impulse response filter for removing said at least one dependency of the source signal.

* * * * *